(12) United States Patent
Giri et al.

(10) Patent No.: US 11,668,260 B2
(45) Date of Patent: *Jun. 6, 2023

(54) CONTROL LOGIC CIRCUIT FOR CONNECTING MULTIPLE HIGH SIDE LOADS IN ENGINE CONTROL MODULE

(71) Applicant: Cummins Inc., Columbus, IN (US)

(72) Inventors: Abhik Giri, Baharagora (IN); Ashish Raj Jain, Indianapolis, IN (US); Ming Feng, Columbus, IN (US); Mark Swain, Columbus, IN (US)

(73) Assignee: Cummins Inc., Columbus, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/521,538

(22) Filed: Nov. 8, 2021

(65) Prior Publication Data
US 2022/0065186 A1 Mar. 3, 2022

Related U.S. Application Data

(63) Continuation of application No. 16/633,118, filed as application No. PCT/US2017/044828 on Aug. 1, 2017, now Pat. No. 11,168,638.

(51) Int. Cl.
*F02D 41/28* (2006.01)
*F02D 41/20* (2006.01)
*H02J 7/00* (2006.01)

(52) U.S. Cl.
CPC ............. *F02D 41/28* (2013.01); *F02D 41/20* (2013.01); *F02D 2041/2068* (2013.01); *F02D 2400/14* (2013.01); *H02J 7/0063* (2013.01)

(58) Field of Classification Search
CPC ........ F02D 41/20; F02D 41/221; F02D 41/28; F02D 2041/2068; F02D 41/26;
(Continued)

(56) References Cited

U.S. PATENT DOCUMENTS

| 4,307,455 A | 12/1981 | Juhasz et al. |
| 5,510,950 A | 4/1996 | Bills et al. |

(Continued)

FOREIGN PATENT DOCUMENTS

| CN | 103498732 | 1/2014 |
| DE | 10 2010 015 095 A1 | 10/2011 |

(Continued)

OTHER PUBLICATIONS

International Search Report and Written Opinion for International Application No. PCT/US17/44828, dated Oct. 10, 2017, 9 pages.

*Primary Examiner* — Ryan Johnson
(74) *Attorney, Agent, or Firm* — Foley & Lardner LLP

(57) ABSTRACT

Methods and apparatuses for connecting multiple loads with a common return pin in engine control module application are disclosed. Only one of the multiple loads can be connected to a power source at a time. At the high side, each load is coupled to the power source through a respective pin at a connector. At the low side, the multiple loads share a common return pin at the connector that connects the loads to the ground. When a first load is connected to the power source at the high side, a first low side driver circuit is used to connect the first load to the ground at the low side. When a second load is connected to the power source at the high side, the second low side driver circuit is used to connect the second load to the ground at the low side.

20 Claims, 2 Drawing Sheets

(58) Field of Classification Search
CPC ........ Y02T 10/40; H02J 7/0063; B60R 16/03; B60R 16/0315
See application file for complete search history.

(56) References Cited

U.S. PATENT DOCUMENTS

| | | | |
|---|---|---|---|
| 5,752,482 | A | 5/1998 | Roettgen et al. |
| 6,580,288 | B1 | 6/2003 | Klapproth |
| 6,591,813 | B1 | 7/2003 | McCoy et al. |
| 7,366,577 | B2 | 4/2008 | Disanza et al. |
| 11,168,638 | B2 * | 11/2021 | Giri .................. F02D 41/28 |
| 2004/0160725 | A1 | 8/2004 | Gu |
| 2006/0241794 | A1 | 10/2006 | Burkatovsky |
| 2007/0262656 | A1 | 11/2007 | Fulks et al. |
| 2011/0087422 | A1 | 4/2011 | Czekala et al. |
| 2013/0229221 | A1 | 9/2013 | Pan et al. |
| 2015/0308399 | A1 | 10/2015 | Hoban et al. |
| 2016/0003210 | A1 | 1/2016 | Andersson et al. |
| 2016/0053730 | A1 | 2/2016 | Meyer et al. |
| 2016/0192695 | A1 | 7/2016 | Bae et al. |
| 2016/0265498 | A1 | 9/2016 | Puckett et al. |
| 2017/0138292 | A1 | 5/2017 | Schweikert et al. |

FOREIGN PATENT DOCUMENTS

| | | |
|---|---|---|
| DE | 10 2011 087 432 | 2/2013 |
| EP | 2 390 488 | 11/2011 |
| GB | 2 463 024 | 3/2010 |
| JP | S62-233473 | 10/1987 |
| JP | 2004-011494 | 1/2004 |
| JP | 2011-214606 | 10/2011 |
| JP | 2016-192695 | 11/2016 |

\* cited by examiner

CONTROL LOGIC CIRCUIT FOR CONNECTING MULTIPLE HIGH SIDE LOADS IN ENGINE CONTROL MODULE

CROSS-REFERENCE TO RELATED APPLICATIONS

This Application is a continuation of U.S. application Ser. No. 16/633,118 entitled "Control Logic Circuit for Connecting Multiple High Side Loads in Engine Control Module," filed Jan. 22, 2020, which is a U.S. national stage application of International Application No. PCT/US2017/044828, entitled "Control Logic Circuit for Connecting Multiple High Side Loads With Common Return Pin in Engine Control Module Application," filed Aug. 1, 2017, each of which are incorporated herein by reference in their entirety.

TECHNICAL FIELD

The present disclosure generally relates to control logic circuits for engine control modules.

BACKGROUND

Engine control module (ECM) can control power supply to various loads through switch devices (e.g., MOSFET switches). In some applications, multiple loads can share a single voltage source (e.g., battery), each being coupled to the voltage source through a respective high side driver circuit. At the low side, the multiple loads share a common return pin that connects the loads to the ground through a shared low side driver circuit. Some loads are capacitive in nature like Variable Geometry Turbocharger (VGT) Load which has very high initial inrush current. The in-rush current may cause the ECM to generate a false fault code. It is desirable to avoid the generation of false fault code due to the in-rush current.

SUMMARY

One embodiment relates to an engine control module. The engine control module comprises a first high side driver circuit configured to control connection of a first load to a voltage source. The first high side driver circuit is coupled to the first load through a first pin of a connector. The module also comprises a second high side driver circuit configured to control connection of a second load to the voltage source. The second high side driver circuit is coupled to the second load through a second pin of the connector. Only one of the first load and the second load is connected to the voltage source at a time. The module further comprises a first low side driver circuit configured to control connection of the first load to a ground. The first low side driver circuit is coupled to the first load through a common return pin of the connector. The module comprises a second low side driver circuit configured to control connection of the second load to the ground. The second low side driver circuit is coupled to the second load through the common return pin. A microcontroller is coupled to and configured to control the first high side driver circuit, the second high side driver circuit, the first low side driver circuit, and the second low side driver circuit. The microcontroller is configured to determine which of the first load and the second load to connect, in response to determining the first load to connect, use the first high side driver circuit to connect the first load to the voltage source and the first low side driver circuit to connect the first load to the ground, and in response to determining the second load to connect, use the second high side driver circuit to connect the second load to the voltage source and the second low side driver circuit to connect the second load to the ground.

Another embodiment relates to a method for coupling a first load and a second load wherein only one of the first load and the second load is connected at a time. The method comprises determining which of the first load and the second load to connect. In response to determining the first load to connect, the method uses a first high side driver circuit to connect the first load to a voltage source and a first low side driver circuit to connect the first load to a ground. The first high side driver circuit is coupled to the first load through a first pin of a connector, and first low side driver circuit is coupled to the first load through a common return pin of the connector. In response to determining the second load to connect, the method uses a second high side driver circuit to connect the second load to the voltage source and a second low side driver circuit to connect the second load to the ground. The second high side driver circuit is coupled to the second load through a second pin of the connector, and the second low side driver circuit is coupled to the second load through the common return pin.

Yet another embodiment relates to a circuit comprising a first high side driver circuit configured to control connection of a first load to a voltage source. The first high side driver circuit is coupled to the first load through a first pin of a connector. The circuit also comprises a second high side driver circuit configured to control connection of a second load to the voltage source. The second high side driver circuit is coupled to the second load through a second pin of the connector. Only one of the first load and the second load is connected to the voltage source at a time. The circuit further comprises a first low side driver circuit configured to control connection of the first load to a ground. The first low side driver circuit is coupled to the first load through a common return pin of the connector. The circuit comprises a second low side driver circuit configured to control connection of the second load to the ground. The second low side driver circuit is coupled to the second load through the common return pin.

These and other features, together with the organization and manner of operation thereof, will become apparent from the following detailed description when taken in conjunction with the accompanying drawings.

DETAILED DESCRIPTION

Figure 1:
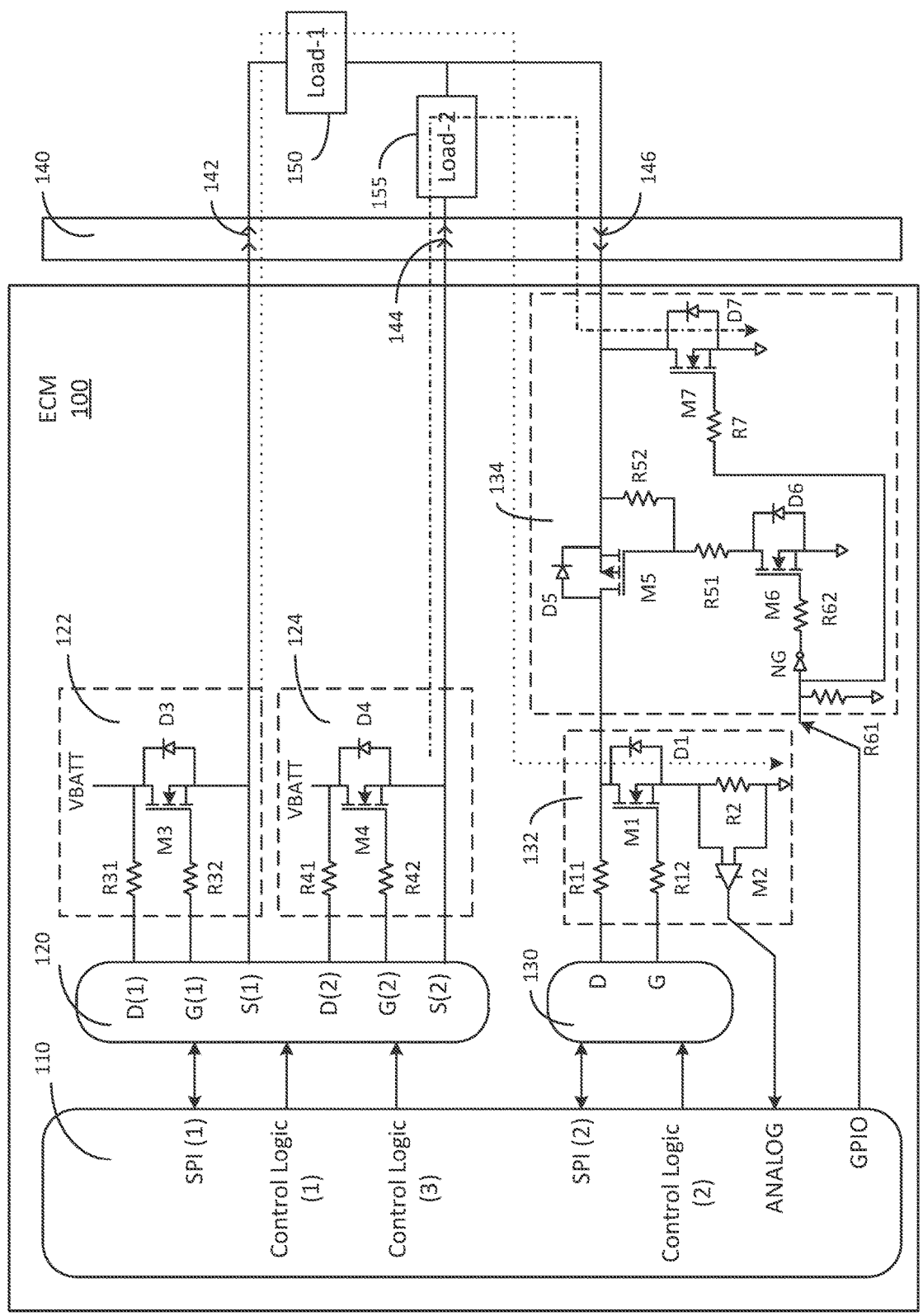
FIG. 1 is a schematic diagram of an engine control module (ECM) in connection with multiple loads, according to an example embodiment.

For the purpose of promoting an understanding of the principles of the disclosure, reference will now be made to the embodiments illustrated in the drawings and specific language will be used to describe the same. It will nevertheless be understood that no limitation of the scope of the disclosure is thereby intended, any alternations and further modifications in the illustrated embodiments, and any further applications of the principles of the disclosure as illustrated therein as would normally occur to one skilled in the art to which the disclosure relates are contemplated herein.

Referring to the Figures generally, the various embodiments disclosed herein relate to control logic circuits for connecting multiple high side loads with a common return pin in engine control module (ECM) applications. In some embodiments, the multiple loads share a single voltage source (e.g., battery) at the high side, each being coupled to the voltage source through a respective high side driver circuit. At the low side, the multiple loads share a common return pin that connects the loads to the ground. A first low side driver circuit and a second low side driver circuit are connected in series between a control logic circuit and the common return pin. Only one load can be connected to the voltage source at a time. The control logic circuit controls the high side driver circuits to switch the connection between/among the multiple loads. In response to a first load being connected at the high side, the control logic circuit uses the first low side driver circuit to connect the first load to the ground. In response to a second load being connected at the high side, the control logic circuit uses the second low side driver circuit to connect the second load to the ground. Since separate low side driver circuits are used, false fault code due to the in-rush current can be avoided.

Referring now to FIG. 1, a schematic diagram of an ECM 100 in connection with multiple loads is shown according to an example embodiment. The ECM 100 may control operation of an engine installed on an equipment. The equipment may be, for example, vehicles, stationary facilities, industrial work machines, and so on. The vehicles may include on-road vehicles (e.g., trucks, buses, etc.), off-road vehicles (e.g., four-wheelers, all-terrain vehicle, tractors, lawn mowers, snowmobiles), marine vessels (e.g., ships, submarines, boats, yachts, cruise ships), construction equipment (e.g., concrete trucks, hand-operated tools, loaders, boom lifts), mining equipment (e.g., mobile mining crushers, dozers, loaders), oil and gas equipment (e.g., drilling apparatuses, dozers, loaders, rigs), or any other type of vehicles. The engine may include an internal combustion engine or any other suitable prime mover that consumes fuel (e.g., gasoline, diesel fuel, natural gas, etc.) during operation. The engine may be a large gas engine, a diesel engine, a dual fuel engine (natural gas-diesel mixture), a hybrid electric-natural gas-fossil fuel engine, or any other type of engine.

The ECM 100 may be a programmable electronic device that controls various aspects of operation for the engine, such as control the amount of air and/or fuel sent to the engine cylinder(s) per engine cycle, ignition timing, variable valve timing, and operation of other subsystems of the engine (e.g., aftertreatment system). What is of interest in the present disclosure is that the ECM 100 can control power supply to various loads 150 and 155 in the equipment. Although two loads (e.g., a first load 150 and a second load 155) are shown in FIG. 1, it should be understood that any suitable number of loads can be controlled by the ECM 100. The loads 150 and 155 may include various types of electric equipment, such as a blade, a wheel, a drill, a vehicle transmission, an air conditioners, lighting, entertainment deices, and/or other different devices.

In some embodiments, the ECM 100 may include a processor and memory (not shown in the present Figure). The processor may be implemented as a general-purpose processor, an application specific integrated circuit (ASIC), one or more field programmable gate arrays (FPGAs), a digital signal processor (DSP), a group of processing components, or other suitable electronic processing components. The memory may include one or more tangible, non-transient volatile memory or non-volatile memory, e.g., NVRAM, RAM, ROM, Flash Memory, hard disk storage, etc.). In some embodiments, the ECM 100 is coupled to various sensors and actuator systems disposed throughout the equipment. In operation, the ECM 100 receives data from the sensors, receives performance parameters and/or instructions stored in the memory, and outputs signals controlling various components of the engine based on the sensor data and instructions.

For the ease of explanation, many components of the ECM 100 are not shown in the present Figure. The ECM 100 is shown to include a microcontroller 110, a high side pre-driver 120, a first high side driver circuit 122, a second high side driver circuit 124, a low side pre-driver 130, a first low side driver circuit 132, and a second low side driver circuit 134. The microcontroller 110 is configured to control power supply to the first load 150 and second load 155 coupled to the ECM 100 through an ECM connector 140. The first load 150 and second load 155 use separate high side pins 142 and 144 but share a common return pin 146 of the ECM connector 140 at the low side. That is to say, the first load 150 is connected to the high side through a first pin 142 and to the low side through the common return pin 146; the second load 155 is connected to the high side through a second pin 144 and to the low side through the common return pin 146. As used herein, the "high side" refers to a driver circuit configured to connect or disconnect a power source (e.g., battery) to or from a corresponding load, and therefore source current to the corresponding load. As used herein, the "low side" refers to a driver circuit configured to connect or disconnect a corresponding load to a ground, and therefore sink current from the corresponding load. Only one of the first load 150 and second load 155 can be connected to the power source at a time.

The microcontroller 110 may include a programmable logic circuit formed on a semiconductor chip, such as a field programmable gate array (FPGA), a programmable logic device (PLD), a programmable logic array (PLA), etc. The microcontroller 110 may be configured to receive input signals from the processor (not shown in the present Figure) of the ECM 100. The input signals indicate which load (i.e., first load 150 or second load 155) is to be connected. In response to the input signals, the microcontroller 110 is configured to output signals to control the first high side driver circuit 122, the second high side driver circuit 124, the first low side driver circuit 132, and the second low side driver circuit 134 to make the indicated connection.

The microcontroller 110 may include a plurality of pins configured to carry signals. As shown, the microcontroller 110 includes a "SPI (1)" pin and a "Control Logic (1)" pin coupled to the high side pre-driver 120. In some embodiments, the "Control Logic (1)" pin is enabled to select G(1) of high side pre-driver 120 to source voltage to M3. The "SPI (1)" pin is configured to read or write data (e.g., voltage data) from or to the pin of the high side pre-driver 120.

The high side pre-driver 120 includes two sets of pins for communicating with the first high side driver circuit 122 and the second high side driver circuit 124 separately. The first high side driver circuit 122 includes a switch device M3, for example, a MOSFET. It should be understood that instead of a MOSFET, other types of transistors, gates, or switching devices (e.g., other types of FETs) can also be used as the switch device M3. The drain of the switch device M3 is coupled to a power source, for example, a battery that has a voltage VBATT. The drain is also coupled to the "D(1)" pin of the high side pre-driver 120 through a resistor R31. The gate of the switch device M3 is coupled to the "G(1)" pin of the high side pre-driver 120 through a resistor R32. The source of the switch device M3 is coupled to the "S(1)" pin of the high side pre-driver 120 as well as a first pin 142 of the ECM connector 140. Diode D3 is the body diode of the switch device M3 between the drain and source.

In operation, if the first load 150 is to be connected to the power source, the "Control Logic (1)" pin of the microcontroller 110 selects the "G(1)" pin of the high side pre-driver 120 to source voltage to M3. The "G(1)" pin then applies a turn-on voltage to the gate of the switch device M3, which is high enough to turn on M3 so that the voltage of the power source (e.g., VBATT) can pass M3 and be applied to the first load 150. If the first load 150 is to be disconnected from the power source, the "Control Logic (1)" pin of the microcontroller 110 is disabled and the "G(1)" pin of the high side pre-driver 120 sinks the voltage to ground. The "G(1)" pin then apply a zero or low voltage to the gate of the switch device M3, which is to turn off M3 so that the power voltage is disconnected from the first load 150.

The second high side driver circuit 124 may work similarly to the first high side driver circuit 122. In particular, The second high side driver circuit 124 includes a switch device M4, for example, a MOSFET. The drain of the switch device M4 is coupled to the power source, for example, a battery that has the voltage VBATT. The drain is also coupled to the "D(2)" pin of the high side pre-driver 120 through a resistor R41. The gate of the switch device M4 is coupled to the "G(2)" pin of the high side pre-driver 120 through a resistor R42. The source of the switch device M4 is coupled to the "S(2)" pin of the high side pre-driver 120 as well as a second pin 144 of the ECM connector 140. Diode D4 is the body diode of the switch device M4 between the drain and source.

In operation, if the second load 155 is to be connected to the power source, the "Control Logic (3)" pin of the microcontroller 110 is enabled to select G (2) to source voltage to M4. The "G(2)" pin then applies a turn-on voltage to the gate of the switch device M4, which is high enough to turn on M4 so that the voltage of the power source (e.g., VBATT) can pass M4 and be applied to the second load 155. If the second load 155 is to be disconnected from the power source, the "Control Logic (3)" pin of the microcontroller 110 is disabled and G (2) sinks the voltage to ground. The "G(2)" pin then apply a zero or low voltage to the gate of the switch device M4, which is to turn off M4 so that the power voltage is disconnected from the second load 155.

It should be understood that the structure of the first and second high side driver circuits 122 and 124 as well as the pin arrangements of the high side pre-driver 120 are illustrated by way of example only and not by way of limitation, any suitable driver circuits and pin arrangement can be used for the present disclosure.

For the low side control, the microcontroller 110 includes a "SPI (2)" pin and a "Control Logic (2)" pin coupled to the low side pre-driver 130, an "ANALOG" pin coupled to the first low side driver circuit 132, and a "GPIO" pin coupled to the second low side driver 134. In some embodiments, the "Control Logic (2)" pin is configured to carry a signal from the micromicrotroller 110 to the low side pre-driver 130 to select gate of low side pre-driver 130 (G). The "SPI (2)" pin is configured to read or write data (e.g., voltage data) from or to the pin of the low side pre-driver 130

The low side pre-driver 130 includes pins "D" and "G" for communicating with the first low side driver circuit 132. The first low side driver circuit 132 includes a switch device M1, for example, a MOSFET. It should be understood that instead of a MOSFET, other types of transistors, gates, or switching devices (e.g., other types of FETs) can also be used as the switch device M1. The drain of the switch device M1 is coupled to the "D" pin of the low side pre-driver 130 through a resistor R11. The gate of the switch device M1 is coupled to the "G" pin of the low side pre-driver 130 through a resistor R12. The source of the switch device M1 is coupled to the ground through a resistor R2. Diode D1 is the body diode of the switch device M1 between the drain and source.

An operational amplifier M2 is connected in parallel with the resistor R2 for sensing the current flowing through the resistor R2. The output of the operational amplifier M2 is coupled to the "ANALOG" pin of the microcontroller 110 so that the microcontroller 110 can read the current data through the "ANALOG" pin. In some embodiments, when the current is large (e.g., larger than a predefined threshold), the ECM 100 may determine that a fault has occurred and generate a fault code. In further embodiment, the equipment on which the ECM 100 is installed includes an onboard diagnostic system (OBD) (not shown in the present Figure) configured to diagnose the performance of the components and subsystems of the equipment. The ECM 100 may report the unusual current data to the OBD for diagnosis.

In some embodiments, the second low side driver circuit 134 includes three switch devices M5, M6, and M7. The drain of the switch device M7 is coupled to the common return pin 146 of the ECM connector 140. The source of M7 is coupled to the ground. The gate of M7 is coupled to the "GPIO" pin of the microcontroller 110 through a resistor R7. When the control logic output from the "GPIO" pin is "1," the voltage applied to the gate of M7 is high so that M7 may be turned on. When the control logic output from the "GPIO" pin is "0," the voltage applied to the gate of M7 is low so that M7 may be turned off. Diode D7 is the body diode of M7 between the source and drain.

The source of the switch device M6 is coupled to the ground. The gate of M6 is coupled to the "GPIO" pin of the microcontroller 110 through a resistor R62 and a NOT gate (also called an inverter) NG. Due to the NOT gate NG, the voltage applied to the gate of M6 is opposite to the control logic output from the "GPIO" pin. In particular, when the control logic output from "GPIO" is "0," the voltage applied to the gate of M6 is high so that M6 may be turned on. When the control logic output from "GPIO" is "1," the voltage applied to the gate of M6 is low so that M6 may be turned off. The drain of M6 is coupled to the gate of M5 through a resistor R51. Diode D6 is the body diode of M6 between the source and drain. A resistor R61 may be connected between the "GPIO" pin and the ground.

The on or off of the switch device M5 depends on the state of M6. As described above, the gate of M5 is coupled to the drain of M6 through the resistor R51. The gate of M5 is also connected to the common return pin 146 through a resistor R52. The drain of M5 is connected to the common return pin 146. The source of M5 is connected to the "D" pin of the low side pre-driver 130 through the resistor R11. When the switch device M6 is on, the voltage applied to the gate of M5 is high so that M5 may be turned on. When M5 is on, the common return pin 146 is connected to the "D" pin of the low side pre-driver 130. When the switch device M6 is off, the voltage applied to the gate of M5 is low so that M5 may be turned off. When M5 is off, the common return pin 146 is disconnected from the "D" pin of the low side pre-driver 130.

As described above, only one of the first and second loads 150 can be connected to the power source at a time. In response to the first load 150 being connected to the power source at the high side, the microcontroller 110 outputs a control logic "0" at the "GPIO" pin. Due to the NOT gate NG, the voltage applied to the gate of M6 is high so that M6 may be turned on, which may cause the switch device M5 to turn on. At the same time, the voltage applied to the gate of M7 is low so that M7 may be turned off. When M5 is on, the common return pin 146 is connected to the "D" pin of the low side pre-driver 130. The "Control Logic (2)" pin of the microcontroller 110 enables the "G" pin of the low side pre-driver 130. The "G" pin then applies a turn-on voltage to the gate of the switch device M1, which is high enough to turn on M1 so that the first load 150 is connected to the ground through M1 and R2. The flow of the current is shown as a dotted line in FIG. 1.

In response to the second load 155 being connected to the power source at the high side, the microcontroller 110 outputs a control logic "1" at the "GPIO" pin. Due to the NOT gate NG, the voltage applied to the gate of M6 is low so that M6 may be turned off, which may cause M5 to turn off. At the same time, the voltage applied to the gate of M7 is high so that M7 is turned on. When M5 is off, the common return pin 146 is disconnected from the "D" pin of the low side pre-driver 130. When M7 is on, the common return pin 146 is connected to the ground through M7. The flow of the current is shown as a dash dotted line in FIG. 1. As described, since first load does not carry inrush current, the low side pre driver (130) is used and Current is sensed. But due to high initial inrush current of second load, low side pre driver (130) is to be bypassed by M5, and M7 is used to connect return pin (146) to ground. Thus the ECM 100 would not generate a fault code reporting the situation.

It should be understood that the structure of the first and second low side driver circuits 132 and 134 as well as the pin arrangements of the low side pre-driver 130 are illustrated by way of example only and not by way of limitation, any suitable driver circuits and pin arrangement can be used for the present disclosure.

Figure 2:
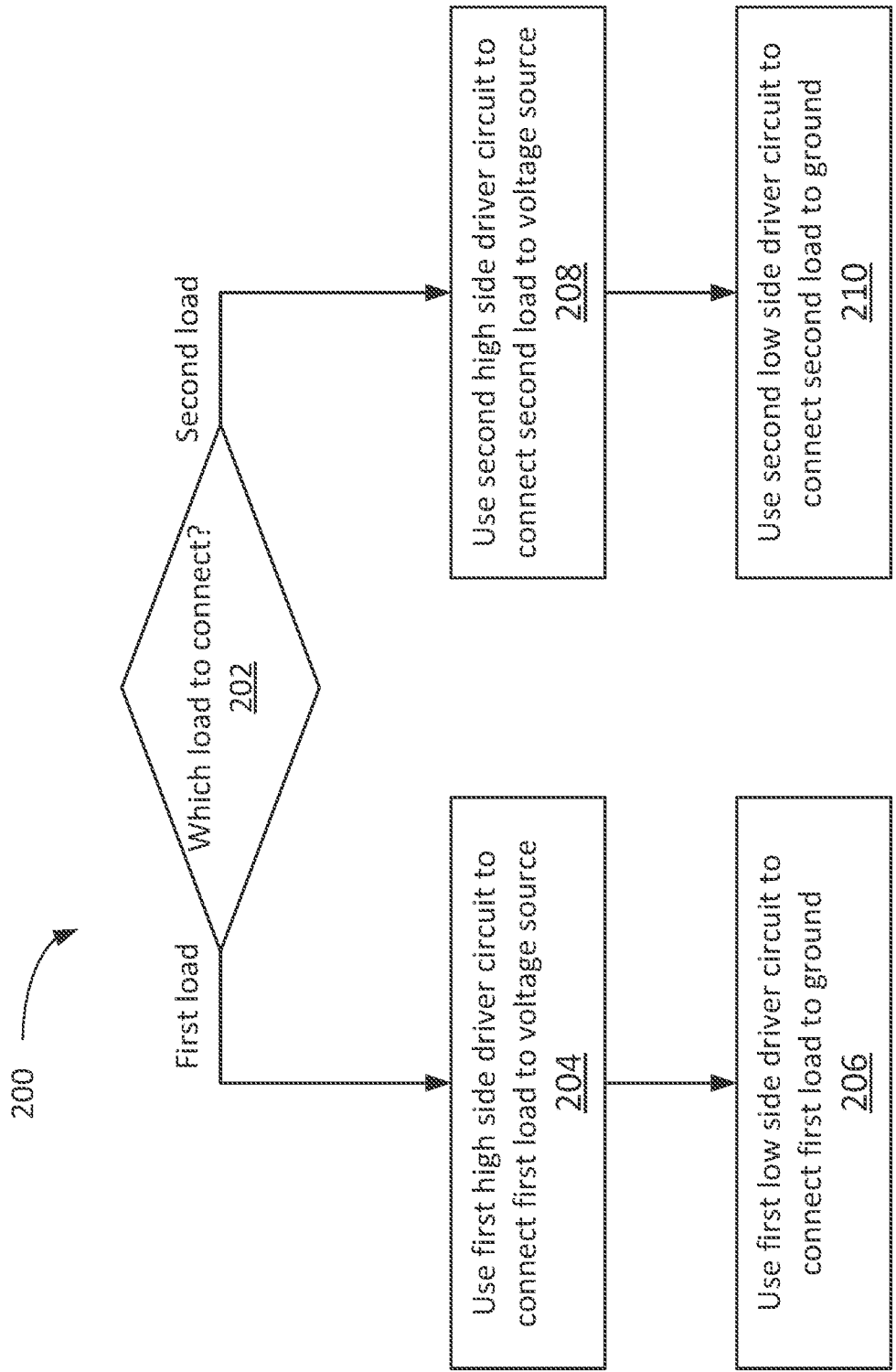
FIG. 2 is a flow diagram showing a method for connecting multiple loads with a common return pin, according to an example embodiment.

Referring to FIG. 2, a flow diagram 200 of a method for connecting multiple loads with a common return pin is shown, according to an example embodiment. The method can be implemented by the ECM 100 of FIG. 1. In some embodiments, the multiple loads share a single voltage source (e.g., battery) at the high side, each being coupled to the voltage source through a respective high side driver circuit. In particular, a first high side driver circuit is configured to control connection of a first load to a voltage source, and the first high side driver circuit is coupled to the first load through a first pin of a connector. A second high side driver circuit is configured to control connection of a second load to the voltage source, and the second high side driver circuit is coupled to the second load through a second pin of the connector. The first and second high side driver circuits may have the same or similar structure as the first and second high side driver circuits 122 and 124 shown in FIG. 1. Only one of the first and second loads can be connected to the voltage source at a time.

At the low side, the multiple loads share a common return pin that connects the loads to the ground. In particular, a first low side driver circuit is configured to control connection of the first load to the ground, and the first low side driver circuit is coupled to the first load through a common return pin of the connector. A second low side driver circuit is configured to control connection of the second load to the ground, and the second low side driver circuit is coupled to the second load through the common return pin. The first and second low side driver circuits may have the same or similar structure as the first and second low side driver circuits 132 and 134 shown in FIG. 1.

A microcontroller is coupled to and configured to control the first high side driver circuit, the second high side driver circuit, the first low side driver circuit, and the second low side driver circuit. The microphone controller may be the same as or similar to the microcontroller 110 shown in FIG. 1.

At an operation 202, the microcontroller determines which load is to be connected to the voltage source. The microcontroller can receive an instruction from a processor of the ECM.

In response to determining that the first load is to be connected, the microcontroller uses the first high side driver circuit to connect the first load to the voltage source at the high side, at operation 204. As discussed above with reference to FIG. 1, the "Control Logic (1)" pin of the microcontroller 110 is enabled to select the "G(1)" pin of the high side pre-driver 120 to source voltage to M3. The "G(1)" pin then applies a turn-on voltage to the gate of the switch device M3, which is high enough to turn on M3 so that the voltage of the power source (e.g., VBATT) can pass M3 and be applied to the first load 150.

The microcontroller uses the first low side driver circuit to connect the first load to the ground, at operation 206. As discussed above with reference to FIG. 1, the microcontroller 110 outputs a control logic "0" at the "GPIO" pin. Due to the NOT gate NG, the voltage applied to the gate of M6 is high so that M6 may be turned on, which may cause the switch device M5 to turn on. At the same time, the voltage applied to the gate of M7 is low so that M7 may be turned off. When M5 is on, the common return pin 146 is connected to the "D" pin of the low side pre-driver 130. The "Control Logic (2)" pin of the microcontroller 110 selects the "G" pin of the low side pre-driver 130. The "G" pin then applies a turn-on voltage to the gate of the switch device M1, which is high enough to turn on M1 so that the first load 150 is connected to the ground through M1 and R2.

In response to determining that the second load is to be connected, the microcontroller uses the first high side driver circuit to connect the second load to the voltage source at the high side, at operation 208. In particular, the "Control Logic (3)" pin of the microcontroller 110 is enabled to select the "G(2)" pin of the high side pre-driver 120 to source voltage to M4. The "G(2)" pin then applies a turn-on voltage to the gate of the switch device M4, which is high enough to turn on M4 so that the voltage of the power source (e.g., VBATT) can pass M4 and be applied to the second load 155.

The microcontroller uses the second low side driver circuit to connect the second load to the ground, at operation 210. In particular, the microcontroller 110 outputs a control logic "1" at the "GPIO" pin. Due to the NOT gate NG, the voltage applied to the gate of M6 is low so that M6 may be turned off, which may cause M5 to turn off. At the same time, the voltage applied to the gate of M7 is high so that M7 is turned on. When M5 is off, the common return pin 146 is disconnected from the "D" pin of the low side pre-driver 130. When M7 is on, the common return pin 146 is connected to the ground through M7.

As may be utilized herein, the terms "approximately," "about," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "middle," "above," "below," etc.) are merely used to describe the position of various elements in the drawings. It should be noted that the position of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

Further, reference throughout this specification to "one embodiment", "an embodiment", "an example embodiment", or similar language means that a particular feature, structure, or characteristic described in connection with the embodiment is included in at least one embodiment of the present invention. Thus, appearances of the phrases "in one embodiment", "in an embodiment", "in an example embodiment", and similar language throughout this specification may, but do not necessarily, all refer to the same embodiment.

Accordingly, the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

While this specification contains specific implementation details, these should not be construed as limitations on the scope of any inventions or of what may be claimed, but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be depicted in a particular order, this should not be understood as requiring that such operations be performed in the particular order shown or in sequential order, or that all operations be performed, to achieve desirable results. Moreover, the separation of various aspects of the implementations described above should not be understood as requiring such separation in all implementations, and it should be understood that the described methods can generally be integrated in a single application or integrated across multiple applications.

What is claimed is:

1. An electronic control module comprising:
    a first high side driver circuit configured to control connection of a first load to a voltage source;
    a second high side driver circuit configured to control connection of a second load to the voltage source, wherein only one of the first load and the second load is connected to the voltage source at a time;
    a first low side driver circuit configured to control connection of the first load to a ground, wherein the first low side driver circuit is coupled to the first load through a common element of a connector;
    a second low side driver circuit configured to control connection of the second load to the ground, wherein the second low side driver circuit is coupled to the second load through the common element of the connector; and
    a controller configured to:
        selectively use the first high side driver circuit to connect the first load to the voltage source and the first low side driver circuit to connect the first load to the ground; and
        selectively use the second high side driver circuit to connect the second load to the voltage source and the second low side driver circuit to connect the second load to the ground.

2. The electronic control module of claim 1, wherein the first high side driver circuit includes a switch device having a source electrically coupled to the common element of the connector, a drain electrically coupled to the voltage source, and a gate controlled by the controller, wherein the controller is configured to turn on the switch device in response to determining the first load to connect.

3. The electronic control module of claim 1, wherein the second high side driver circuit includes a switch device having a source electrically coupled to the common element of the connector, a drain electrically coupled to the voltage source, and a gate controlled by the controller, wherein the controller is configured to turn on the switch device in response to determining the second load to connect.

4. The electronic control module of claim 1, wherein:
    the first low side driver circuit includes a first switch device having a first source, a first drain, and a first gate;
    the second low side driver circuit includes a second switch device having a second source, a second drain, and a second gate, a third switch device having a third source, a third drain, and a third gate, and a fourth switch device having a fourth source, a fourth drain, and a fourth gate;
    the first source, the third source, and the fourth source are electrically coupled to the ground;
    the second source is electrically coupled to the first drain;
    the second drain and the fourth drain are electrically coupled to the common element of the connector;
    the third drain is electrically coupled to the second gate; and
    the first gate, the third gate, and the fourth gate are controlled by the controller.

5. The electronic control module of claim 4, wherein the first low side driver circuit further includes a resistor between the first source and the ground, and the controller is configured to measure a current flowing through the resistor.

6. The electronic control module of claim 4, wherein the fourth gate is electrically coupled to a general-purpose input/output (GPIO) pin of the controller, and the third gate is electrically coupled to the GPIO pin through a NOT gate.

7. The electronic control module of claim 6, wherein the controller is configured to:
in response to determining the first load to connect, turn on the third switch device and turn off the fourth switch device using the GPIO pin, wherein the second switch device is turned on as a result of the third switch device being turned on.

8. The electronic control module of claim 6, wherein the controller is configured to:
in response to determining the second load to connect, turn off the third switch device and turn on the fourth switch device using the GPIO pin, wherein the second switch device is turned off as a result of the third switch device being turned off.

9. A method comprising:
selectively using a first high side driver circuit to connect a first load to a voltage source and a first low side driver circuit to connect the first load to a ground, wherein the first low side driver circuit is coupled to the first load through a common element of a connector; and
selectively using a second high side driver circuit to connect a second load to the voltage source and a second low side driver circuit to connect the second load to the ground, wherein the second low side driver circuit is coupled to the second load through the common element of the connector.

10. The method of claim 9, wherein the first high side driver circuit includes a switch device having a source electrically coupled to the common element of the connector, a drain electrically coupled to the voltage source, and a gate controlled by a controller, wherein the controller turns on the switch device in response to determining the first load to connect.

11. The method of claim 9, wherein:
the first low side driver circuit includes a first switch device having a first source, a first drain, and a first gate;
the second low side driver circuit includes a second switch device having a second source, a second drain, and a second gate, a third switch device having a third source, a third drain, and a third gate, and a fourth switch device having a fourth source, a fourth drain, and a fourth gate;
the first source, the third source, and the fourth source are electrically coupled to the ground;
the second source is electrically coupled to the first drain;
the second drain and the fourth drain are electrically coupled to the common element of the connector;
the third drain is electrically coupled to the second gate; and
the first gate, the third gate, and the fourth gate are controlled by a controller.

12. The method of claim 11, wherein the first low side driver circuit further includes a resistor between the first source and the ground, and the method further comprises measuring a current flowing through the resistor.

13. The method of claim 11, wherein the fourth gate is electrically coupled to a general-purpose input/output (GPIO) pin of the controller, and the third gate is electrically coupled to the GPIO pin through a NOT gate.

14. The method of claim 13, further comprising:
in response to determining the first load to connect, turning on the third switch device and turning off the fourth switch device using the GPIO pin, wherein the second switch device is turned on as a result of the third switch device being turned on.

15. The method of claim 13, further comprising:
in response to determining the second load to connect, turning off the third switch device and turning on the fourth switch device using the GPIO pin, wherein the second switch device is turned off as a result of the third switch device being turned off.

16. An apparatus comprising:
a controller coupled to and configured to control a first high side driver circuit, a second high side driver circuit, a first low side driver circuit, and a second low side driver circuit, the controller configured to:
determine which of a first load and a second load to connect;
in response to determining the first load to connect, use the first high side driver circuit to connect the first load to a voltage source and the first low side driver circuit to connect the first load to a ground, wherein the first low side driver circuit is coupled to the first load through a common element of a connector; and
in response to determining the second load to connect, use the second high side driver circuit to connect the second load to the voltage source and the second low side driver circuit to connect the second load to the ground, wherein the second low side driver circuit is coupled to the second load through the common element of the connector.

17. The apparatus of claim 16, further comprising a circuit comprising:
the first high side driver circuit configured to control connection of the first load to the voltage source, wherein the first high side driver circuit is coupled to the first load through a first element of the connector;
the second high side driver circuit configured to control connection of the second load to the voltage source, wherein the second high side driver circuit is coupled to the second load through a second element of the connector, wherein only one of the first load and the second load is connected to the voltage source at a time;
the first low side driver circuit configured to control connection of the first load to the ground; and
a second low side driver circuit configured to control connection of the second load to the ground.

18. The apparatus of claim 17, wherein the first high side driver circuit includes a switch device having a source electrically coupled to the element of the connector, a drain electrically coupled to the voltage source, and a gate controlled by the controller, wherein the controller is configured to turn on the switch device in response to determining the first load to connect.

19. The apparatus of claim 17, the first low side driver circuit includes a first switch device having a first source, a first drain, and a first gate;
the second low side driver circuit includes a second switch device having a second source, a second drain, and a second gate, a third switch device having a third source, a third drain, and a third gate, and a fourth switch device having a fourth source, a fourth drain, and a fourth gate;

the first source, the third source, and the fourth source are electrically coupled to the ground;

the second source is electrically coupled to the first drain;

the second drain and the fourth drain are electrically coupled to the common element of the connector;

the third drain is electrically coupled to the second gate; and the first gate, the third gate, and the fourth gate are controlled by the controller.

20. The apparatus of claim 19, wherein the first low side driver circuit further includes a resistor between the first source and the ground for measuring a current flowing through the resistor; and wherein the fourth gate is electrically coupled to a general-purpose input/output (GPIO) pin of the controller, and the third gate is electrically coupled to the GPIO pin through a NOT gate.

* * * * *